United States Patent [19]

Skoures et al.

[11] 3,967,209

[45] June 29, 1976

[54] DISCRIMINATING SONIC DETECTION SYSTEM

[75] Inventors: Alexander E. Skoures, Philadelphia, Pa.; Joseph N. Farace, Maple Shade, N.J.

[73] Assignee: The United States of America as represented by the Secretary of the Navy, Washington, D.C.

[22] Filed: Apr. 27, 1973

[21] Appl. No.: 355,996

Related U.S. Application Data

[62] Division of Ser. No. 75,662, Sept. 25, 1970, Pat. No. 3,955,171.

[52] U.S. Cl. .................................. 330/86; 330/35; 330/138; 330/139; 330/141
[51] Int. Cl.[2] ...................... H03F 1/36; H03K 5/20
[58] Field of Search ............... 330/21, 9, 28, 31, 51, 330/85, 86, 30 D, 99, 103, 100, 180; 307/235 R; 328/146, 147

[56] References Cited
UNITED STATES PATENTS

| | | | |
|---|---|---|---|
| 3,581,223 | 5/1971 | Armstrong | 330/86 |
| 3,740,659 | 6/1973 | Matsushima et al. | 330/30 D |
| 3,778,710 | 12/1973 | Snook | 330/9 |

*Primary Examiner*—Nelson Moskowitz
*Attorney, Agent, or Firm*—R. S. Sciascia; Henry Hansen

[57] ABSTRACT

A bistatic velocity detector system for underwater detection of objects of predetermined magnitude wherein the water may be capable of continual variations in velocity. The system includes a compensator that has an automatic gain controlled amplifier whose controlled output signal is applied first to an a.c./d.c. converter and then to an integrator circuit. A first voltage comparator receives the integrated signal to drive a relay for activating an alarm when a threshold is exceeded. A second voltage comparator having a lower reference voltage applied thereto drives an RC timer circuit whose output signal is applied to the gate of a field effect transistor of variable impedance for varying the gain of the operational amplifier. An alternative embodiment includes a dual gate transistor for use in the gain controlled amplification of the loop. The timer circuit is continually charging or discharging and the feedback loop thereby increases or decreases the gain of the amplifier to maintain a constant output value.

5 Claims, 5 Drawing Figures

DISCRIMINATING SONIC DETECTION SYSTEM

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATIONS

This is a division of application Ser. No. 75,662, filed Sept. 25, 1970, now U.S. Pat. No. 3,955,171.

BACKGROUND OF THE INVENTION

The invention relates to an improved system for detecting underwater objects in a river or stream. More particularly, the system provides an improved means for doppler detection of underwater objects in a stream or river of varying velocity. In addition, the system rejects objects below a predetermind magnitude.

The use of doppler sonar systems in the past for the detection of swimmers, floaters or boats as targets has presented problems due to the plurality of speeds with which the target may advance in the water, the shifting velocity of the stream or river itself, and the fact that the detected object although moving in the stream may not be a desired target.

SUMMARY OF THE INVENTION

Accordingly, it is the general purpose of the present invention to provide an improved automatic underwater detector system capable of a high degree of reliability, to be used by unskilled personnel with a minimum of training.

In the present system this is obtained by the detection of a doppler frequency generated in an ensonified media by a swimmer, floater, or a floating object. The detected doppler frequency is applied to twelve narrow band filters that are in turn connected to associated automatic river velocity compensating circuits. The compensating circuits comprise an operational amplifier that in turn applies its output signal to an a.c./d.c. converter. The output of the a.c./d.c. converter is fed to two voltage comparators. One voltage comparator is used to trigger an electronic alarm whenever an input signal exceeds the reference voltage level in the comparator. This is normally set 10 db above the ambient noise. The other voltage comparator triggers a timer circuit whenever the input exceeds its reference voltage by switching from a positive voltage at its output to a negative voltage. This allows an intergrating circuit to apply a negative potential to the gate of a JFET or IGFET to reduce the gain of the amplifier. Once the gain of the amplifier is reduced the amplifier output drops forcing the input to the comparator slightly below its reference. The comparator now switches state discharging the integrator circuit voltage towards ground potential thus increasing slightly the amplifier gain so that the comparator input is a few millivolts above the reference voltage. This forces the comparator to switch states applying a negative potential to the integrator circuit that controls the amplifier gain. Thus, the comparator will be applying a negatively decreasing potential to the gate of the FET always following the amplifier input signal and always adjusting the amplifier gain to provide a constant amplifier output.

DESCRIPTION OF THE PREFERRED EMBODIMENT

Figure 1:
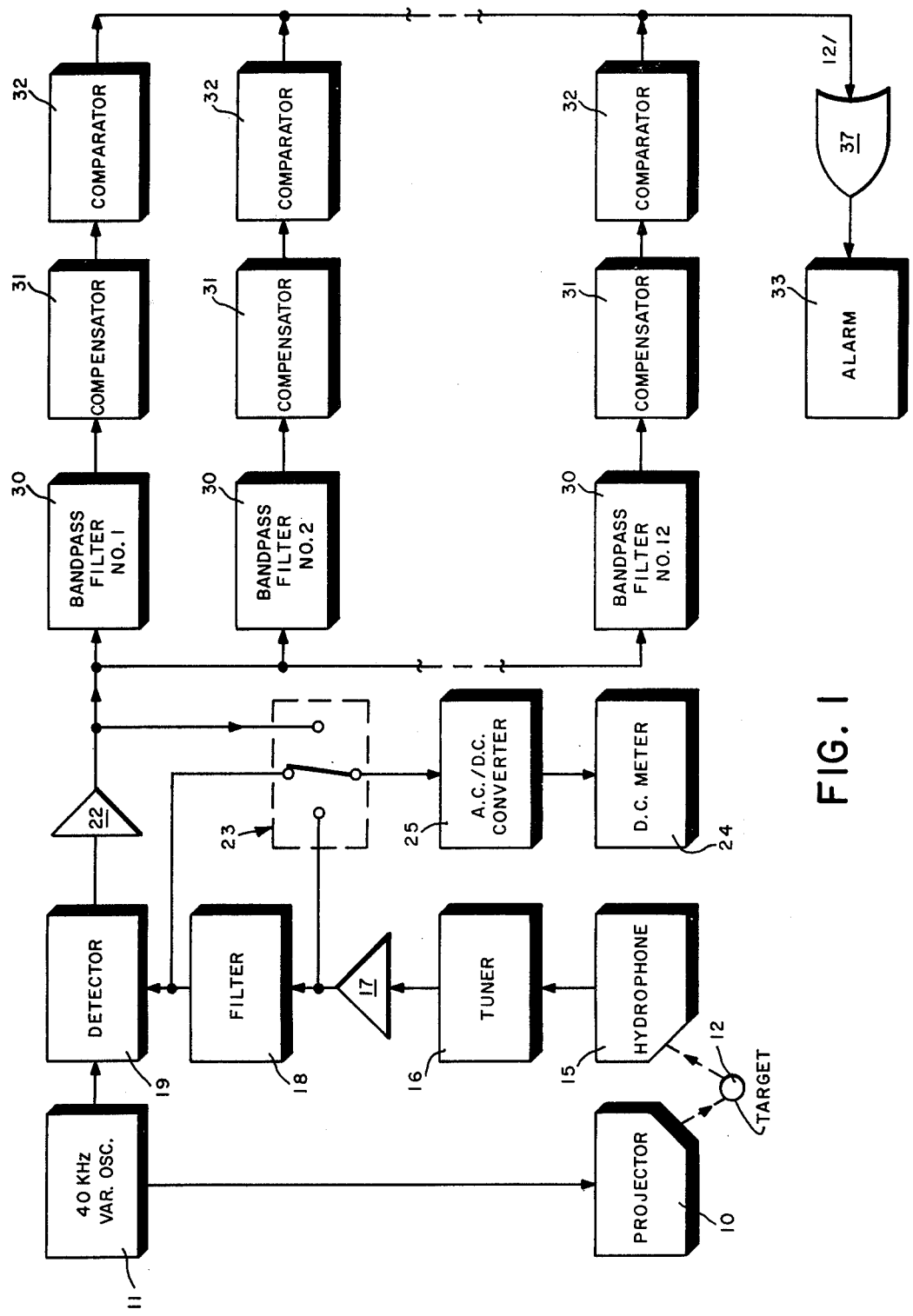
FIG. 1 is a block diagram of a preferred embodiment according to the invention.

Referring now to the drawing and more particularly to FIG. 1, there is shown a projector 10 driven by a 40 kHz variable oscillator 11 that transmits a continuous wave acoustic signal to a media such as water (not shown). The presence of a target 12 in the ensonified media will reflect the generated acoustic signal imposing upon it a generated doppler frequency. A hydrophone 15 senses the acoustic signal and generates an electrical signal, indicative of the applied acoustic signal. This electrical signal is applied to serially connected tuner 16, amplifier 17, filter 18 and detector 19. All are standard well known devices with the filter having a bandpass of from 39 to 41 kHz. The detector 19 receives in addition to the signal from filter 18, a 40 kHz signal from variable oscillator 11. The detector in effect subtracts the 40 kHz signal from the signal received at the hydrophone so that only the doppler frequency appears at the output of detector 19. This signal is in turn amplified by amplifier 22. A three-position manually operated switch 23 is connected so that one may readout on a d.c. meter 24 a signal from either the output of amplifier 17, filter 18 or amplifier 22. The signal selected by switch 23 is applied to an a.c./d.c. converter 25 which in turn supplies a signal to readout meter 24.

Amplifier 22 in addition applies its signal to 12 narrowband filters 30 with center frequencies ranging from 11 to 91 Hz. The output of each of the filters 30 is applied to individual compensators 31 (to be described later) which process the received signals and generate an output signal indicative if such signals meet with predetermined criteria that signifies the presence of a target such as a boat, swimmer or floater. Comparator 32 receives the output signal from compensator 31 and compares the amplitude of the signal to a predetermined constant signal. If the signal from compensator 31 is larger than the predetermined constant signal, a signal is sent to an OR gate 37 that in turn generates an output signal to trigger alarm 33.

Figure 2:
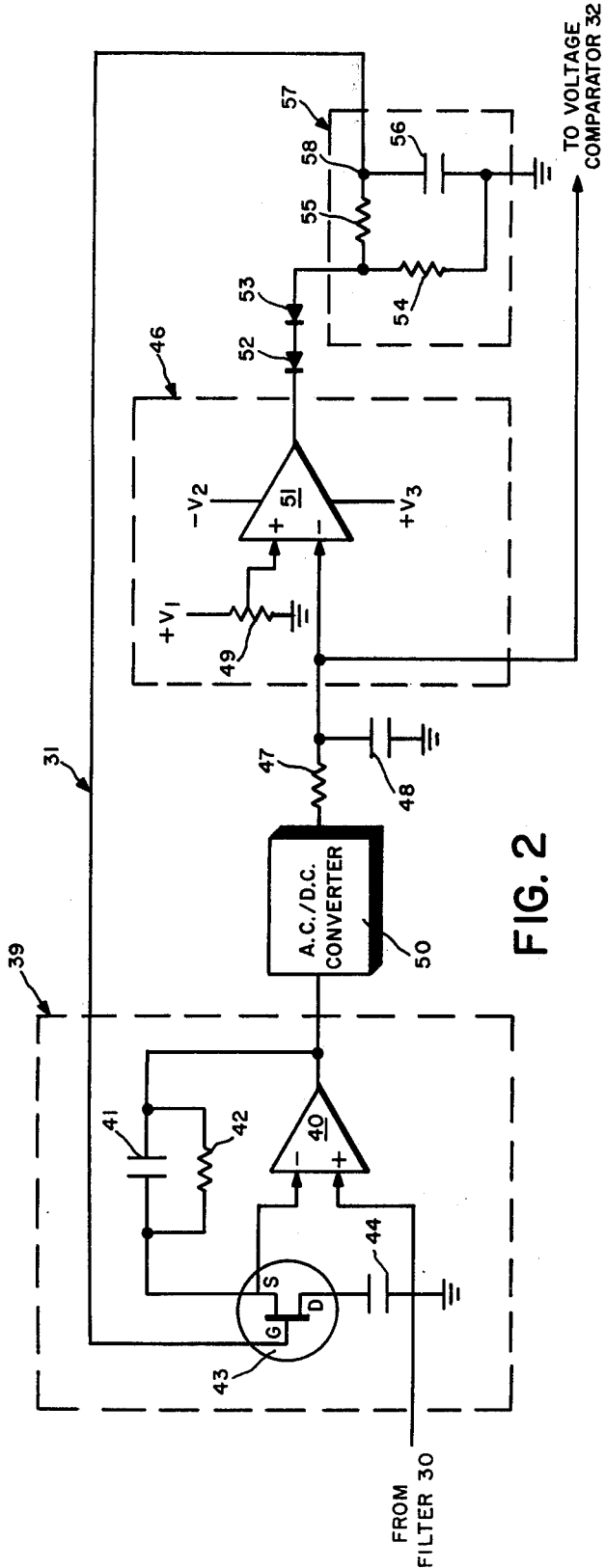
FIG. 2 is a schematic block diagram of the compensator circuit of FIG. 1.

Referring now to FIG. 2 there is shown the compensator 31 of FIG. 1 in which an input signal from filter 30 is applied to the positive terminal of an MC 1533 operational amplifier 40 of amplifier system 39. The amplifier is capable of providing an open loop gain of 90 db and designed to provide a maximum closed loop gain of 60 db. A feedback loop comprising of a capacitor 41 and resistor 42 is connected to the output of operational amplifier 40 and fed back to the source terminal of a field effect transistor 43. The drain of FET 43 is connected to a capacitor 44 whose other terminal is grounded. The source of FET 43 is connected to the negative input terminal of operational amplifier 40.

The output of operational amplifier 40 is in addition connected to an a.c./d.c. converter 50. The output of converter 50 is connected to an RC integrator network comprised of resistor 47 and capacitor 48 that is in turn connected to an operational amplifier 51, used as a voltage comparator. A reference voltage $V_1$ is applied to the positive input terminal of the operational amplifier 51 through a potentiometer 49. The other terminal of potentiometer 49 is grounded. A negative voltage $V_2$ and a positive voltage $V_3$ are also applied to the operational amplifier 51 of voltage comparator 46. The output of voltage comparator 46 is applied to the cathode of the first of a pair of serially connected diodes 52 and 53 the anode of diode 53 is connected to a parallel circuit 57 wherein one path is comprised of resistor 54 and the other path is comprised of a serial connection of resistor 55 and capacitor 56. The opposite terminals of resistor 54 and capacitor 56 are tied together and grounded. The voltage at junction 58, between resistor 55 and capacitor 56 is fed back to the gate of FET 43. In addition, an output at the junction of resistor 47 and capacitor 48 is fed to voltage comparator 32.

The operation of compensator 31 will now be described. It is to be kept in mind that there are twelve such devices with each receiving an output from a respective filter 30 and providing an output to an individual voltage comparator 32.

The output from filter 30 is applied to the positive terminal of operational amplifier 40. The operational amplifier 40 has a feedback loop wherein the parallel circuit of capacitor 41 and resistor 42 provide a low rolloff and capacitor 44 provides a high rolloff as required by the system bandpass. In place of using a resistor in series with capacitor 44 an FET transistor 43 was chosen so that the resistance can be modulated by an additional feedback voltage applied to the gate.

The output of operational amplifier 40 is then applied to a typical a.c./d.c. converter. The output of the a.c./d.c. converter 50 is applied to voltage comparator 46 to compare the amplitude of the incoming signal against a reference voltage applied from potentiometer 49. The voltage comparator 46 is so connected that if the amplifier 51 input signal from converter 50 is increased above a threshold value the OP AMP 51 output voltage switches from a plus voltage in the output to a minus voltage. The minus voltage is passed through diodes 52 and 53 to timer circuit 57. The negative voltage increases across capacitor 56 applying a negative potential to the gate of FET 43 increasing the source to drain resistance which in turn decreases the gain of the amplifier 40. As the gain of the amplifier 40 is being reduced, the voltage comparator 46 input voltage drops below the threshold voltage and the comparator 46 switches states so that capacitor 56 is discharged toward ground increasing the amplifier 40 gain. When the amplifier 40 gain has increased above a specified voltage, the comparator 46 again switches to providing a negative output again reducing the amplifier gain. Thus the comparator 46 will be switching states maintaining the amplifier system 39 output voltage within a few millivolts of its desired value.

At this time it should be pointed out that the output of a.c./d.c. converter 50 has not exceeded the level that provides an output signal from voltage comparator 32 and that would trigger alarm 33.

If an input signal from filter 30 were to increase 40 db, the comparator 46 output would be in its negative state charging capacitor 56 until the gain of the amplifier 40 is reduced to its previous level. The RC constant of the timer 57 is set for five minutes since it is a system requirement. The rise in the voltages throughout the compensator 31 due to a 40 db increase for a sufficient period of time causes the voltage at the output of a.c./d.c. converter 50 to charge capacitor 48 sufficiently to trigger voltage comparator 32 which in turn provides a signal to actuate alarm 33. This is due to the relatively slow acting feedback system. Obviously one could vary the time constant by changing the values of the components in timer 57.

It has therefore been shown that a large increase in the input signal from filter 30 for a sufficient period of time will trigger the alarm circuit 33. If instead of a desired target such as a swimmer, floater or boat crosses the ensonified area, nondesired targets are sensed such as mines, cans, logs, etc. the following operation takes place to prevent a false alarm.

To discriminate between small and large objects so that the system responds to large objects, an integrator circuit comprising resistor 47 and capacitor 48 is provided between the a.c./d.c. converter 50 and the voltage comparator 46. When short duration doppler signals or spikes appear at the input of amplifier 40 there will be generated a short duration d.c. voltage level at the a.c./d.c. converter output. These signals are of too short a duration to sufficiently charge capacitor 48 so as a result neither voltage comparator 32 or 51 sees this increase in signal.

Figure 3:
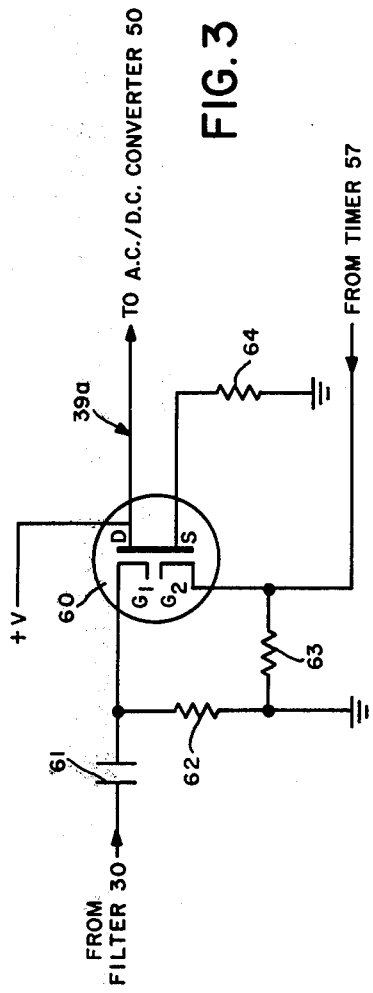
FIG. 3 is a schematic diagram of an alternative embodiment of a portion of FIG. 2.

A second embodiment of the amplifier system 39 is shown as amplifier system 39a in FIG. 3. The signal from filter 30 is applied to capacitor 61 that in turn is connected to gate $G_1$ of a dual gate, N-channel enhancement mode MOS transistor 60. A resistor 62 is connected between $G_1$ of transistor 60 and ground. A resistor 63 is connected between gate $G_2$ of transistor 60 and ground. The source of transistor 60 is connected to ground through resistor 64. A +V bias voltage is applied to the drain of transistor 60.

In the foregoing system transistor 60 is used as an automatic gain controlled amplifier where one gate is used to provide the required amplification, and the second gate is used to modulate the drain to source resistance, and thus the overall gain of the device. In this case the input signal from the filter is applied to the first gate $G_1$ of transistor 60 and the second input to gate $G_2$ is a feedback signal from the timer 57 used to control the amplification. The drain supplies the output to a.c./d.c. converter 50.

It has thus been shown a new device in which a target may be located in a stream or river wherein the velocity of the stream is variable and wherein the system is able to discriminate according to size of the objects in the water as to which object is a target.

It will be understood that various changes in the details, materials, steps and arrangements of parts, which have been herein described and illustrated in order to explain the nature of the invention, may be made by those skilled in the art within the principle and scope of the invention as expressed in the appended claims.

What is claimed is:
1. A voltage compensator comprising:
  an amplifier system adapted to receive at a first terminal an input signal and at a second terminal a feedback signal for providing an output signal of an amplitude indicative of said received signals;
  an a.c./d.c. converter connected to receive the output of said amplifier system for providing a d.c. output level;
  a first integrator circuit connected to the output of said a.c./d.c. converter for providing a time varying voltage level;

comparator means adapted to receive an input from said integrator circuit for comparing said input to a predetermined voltage level for providing an output of a polarity indicative of which of said voltage levels has a larger magnitude;

a diode connected to the output of said voltage comparator for passing signals of only one polarity; and a second integrator circuit adapted to receive the output of said diode for providing a time varying output feedback signal to be connected to said second terminal of said amplifier system.

2. A voltage compensator according to claim 1 wherein said amplifier system further comprises:

a first operational amplifier including as inputs said first terminal and said second terminal and having an output terminal;

a field effect transistor with a source connected to said second terminal, a gate connected to ground the output of said second integrator circuit, and a drain adapted to be connected to ground; and a feedback network connected between said output terminal of said operational amplifier and said source of said field effect transistor.

3. A voltage compensator according to claim 2 wherein said comparator means further includes:

a second operation amplifier adapted to receive a first input signal from said first integrator circuit;

bias means of a predetermined voltage level connected to said operational amplifier;

positive polarity means connected to the output of said operational amplifier if said first input signal is of a larger amplitude then said bias means voltage level; and negative polarity means connected to the ouput of said operational amplifier if the amplitude of said first input signal fails to exceed said bias means voltage level.

4. A voltage compensator according to claim 1 wherein said amplifier system further comprises:

a dual gate transistor having a first and second gate, a drain and a source adapted to receive an input from said filter at the first gate and a feedback from said second integrator circuit at the second gate and said source operatively connected to ground;

bias means connected to the drain of said transistor and said drain adapted to provide an output signal.

5. A voltage compensator according to claim 4 wherein said amplifier system further comprises:

a first resistive circuit connected between said first gate and said second gate; and a second resistive circuit connected between said source and ground.

* * * * *

UNITED STATES PATENT AND TRADEMARK OFFICE
CERTIFICATE OF CORRECTION

PATENT NO. : 3,967,209
DATED : June 29, 1976
INVENTOR(S) : Alexander E. Skoures and Joseph N. Farace It is certified that error appears in the above-identified patent and that said Letters Patent are hereby corrected as shown below:

Column 5, Claim 2, line 18, the word "ground" should be deleted after the word "to".

Column 6, Claim 3, line 7, "ouput" should be spelled "output".

Signed and Sealed this

Ninth Day of November 1976

[SEAL]

Attest:

RUTH C. MASON
Attesting Officer

C. MARSHALL DANN
Commissioner of Patents and Trademarks